(12) United States Patent
Suzuki

(10) Patent No.: US 6,792,021 B1
(45) Date of Patent: Sep. 14, 2004

(54) NEAR FIELD LIGHT GENERATING DEVICE

(75) Inventor: Yujiro Suzuki, Toyonaka (JP)

(73) Assignee: Minolta Co., Ltd., Osaka (JP)

( * ) Notice: Subject to any disclaimer, the term of this patent is extended or adjusted under 35 U.S.C. 154(b) by 149 days.

(21) Appl. No.: 09/588,696

(22) Filed: Jun. 7, 2000

(30) Foreign Application Priority Data

Jun. 14, 1999  (JP) .......................................... 11-166844

(51) Int. Cl.$^7$ ................................................ H01S 5/00
(52) U.S. Cl. ........................................ 372/49; 372/43
(58) Field of Search ...................................... 372/43–50

(56) References Cited

U.S. PATENT DOCUMENTS

| | | | |
|---|---|---|---|
| 4,840,922 A | * | 6/1989 | Kobayashi et al. ............ 372/49 |
| 5,144,634 A | * | 9/1992 | Gasser et al. ................... 372/49 |
| 5,625,617 A | | 4/1997 | Hopkins et al. ............. 369/121 |
| 5,729,393 A | | 3/1998 | Lee et al. .................... 359/819 |

FOREIGN PATENT DOCUMENTS

| | | | | |
|---|---|---|---|---|
| JP | 7-192280 | 7/1995 | | |
| JP | 10190120 A | * | 7/1998 | ............. H01S/3/18 |

* cited by examiner

*Primary Examiner*—Quyen Leung
(74) *Attorney, Agent, or Firm*—Morrison & Foerster LLP

(57) ABSTRACT

Heat diffusion preventing film is formed on the cleavage plane of a semiconductor laser, and thin film comprising a low melting point material, such as indium, is formed on top on the heat diffusion preventing film. When irradiated by the laser light emitted from the semiconductor laser and heated, the irradiated area of the thin film changes in state from crystalline to amorphous and forms a small light transmitting area. Near field light passes through this light transmitting area. The near field light generating device of the present invention uses a simple construction as described above, and complex adjustment is not required. In addition, problems such as laser oscillation failure do not occur.

17 Claims, 5 Drawing Sheets

EVAPORATION SOURCE
(STEARIC ACID)

NEAR FIELD LIGHT GENERATING DEVICE

The present application claims priority to Japanese Patent Application No. 11-166844 filed Jun. 14, 1999, the entire content of which is hereby incorporated by reference.

BACKGROUND OF THE INVENTION

1. Field of the Invention

The present invention pertains to a near field light generating device, and more particularly, to a device that generates near field light used for high-density recording onto an optical recording medium, or for reproduction from such a recording.

2. Description of the Related Art

In the area of optical memories in which information is optically recorded and reproduced, as computers become increasingly faster and more advanced multimedia formats are developed, an optical head that can record a larger amount of information, i.e., in which the recording density is markedly improved, is being sought. A near field light recording technology has been proposed as a technology to realize such an optical head. In a conventional optical memory using laser light, the upper limit of recording density is determined based on the diffraction limit of the light, and recording and reproduction are possible only of marks the size of the wavelength of the light (approximately several hundred nanometers). With an optical memory using the near field light phenomenon that has been proposed in recent years, an optical head comprising a probe that has a small opening smaller than the wavelength of the light or solid immersion lens is placed as close to the recording medium (optical disk) as several tens of nanometers, and recording/reproducing light is irradiated onto the recording medium. Consequently, marks as small as several tens of nanometers, beyond the diffraction limit of the light, may be written and read as signals.

The probe referred to above is made of a medium having a high refractive index and has a small opening, such that near field light may pass through this small opening. For example, Japanese Laid-Open Patent Application No. Hei 7-192280 discloses a fiber probe. However, when fiber is used, optical axis adjustment is necessary for the fiber and prism, which are located between the laser light source and the small opening, and because this adjustment is complex, the manufacturing cost increases. Moreover, this technology has the problem that the weight of the optical head itself increases, which translates into a longer access time.

A solid immersion lens technology is disclosed in U.S. Pat. No. 5,729,393. However, where a solid immersion lens is used, optical axis adjustment is also necessary for such things as the condenser lens and holder, which means that it has the same problem as the fiber probe.

On the other hand, U.S. Pat. No. 5,625,617 discloses a technology in which a concave area is formed on the light exit surface of the semiconductor laser through focus ion beam (FIB) treatment so that near field light may be generated from this concave area. However, since FIB treatment uses a high-energy ion beam, there is a possibility that the light exit surface, which also comprises a cleavage plane that plays an important role as a laser resonant surface, may be damaged, resulting in laser oscillation failure.

SUMMARY OF THE INVENTION

The object of the present invention is to provide a near field light generating device that has a simple construction and that does not require complex optical axis adjustment.

Another object of the present invention is to provide a near field light generating device that does not experience such problems as laser oscillation failure.

These and other objects are attained by a near field light generating device comprising: a light emitting element that emits light from its exit surface; and a thin film that is formed on the exit surface and gains a light transmitting property when irradiated with light from the light emitting element.

The objects described above are also attained by a near field light generating device comprising: a light emitting element that emits light from its exit surface; and a thin film that is formed on the exit surface and gains a light transmitting property when heated.

For the thin film mentioned above, inorganic materials or organic materials having a low melting point are used. If an inorganic material is used, it is preferred that the melting point be 350° C. or less, and more preferably, that a metal material having a melting point of 150° C. or lower be used. It is also preferred that a heat diffusion preventing film exist between the light exit surface and the thin film.

In the near field light generating device pertaining to the present invention, because the area of the thin film irradiated with the light emitted from the light exit surface is heated, it becomes amorphous and transforms into a small light transmitting area. This small light transmitting area functions in the same way as the small opening of the conventional probe, and allows the emitted light to escape as near field light. The irradiated area of the thin film returns to a crystalline state from an amorphous state when the light emission is stopped, thereby ensuring reproducibility.

In other words, the near field light generating device pertaining to the present invention has an extremely simple construction, comprising only a light emitting element and a thin film formed on the light exit surface of the light emitting element, making it compact in size and lightweight. Therefore, the near field light generating device pertaining to the present invention is quite suitable for a near field light optical head.

In addition, because a small light transmitting area that generates near field light is formed in the thin film by means of the light emitted from the light emitting element, the complex process of aligning the optical axes of multiple components is not necessary. The near field light generating device pertaining to the present invention may also be mass-produced using ordinary semiconductor manufacturing technology. Therefore, it may be manufactured at a low cost.

In particular, it is preferred that a semiconductor laser be used as the light source. A semiconductor laser is small in size and lightweight, and is best suited for the near field light generating device in today's market. Further, the present invention does not use a high-energy focus ion beam, and therefore the possibility of damage to the laser's cleavage plane and resulting oscillation failure is eliminated.

The invention itself, together with further objects and attendant advantages, will best be understood by reference to the following detailed description taken in conjunction with the accompanying drawings.

BRIEF DESCRIPTION OF THE DRAWINGS

In the following description, like parts are designated by like reference numbers throughout the several drawing.

DETAILED DESCRIPTION OF THE PREFERRED EMBODIMENTS

The embodiments of the near field light generating device pertaining to the present invention are explained below with reference to the accompanying drawings.
(First Embodiment)

Figure 1:
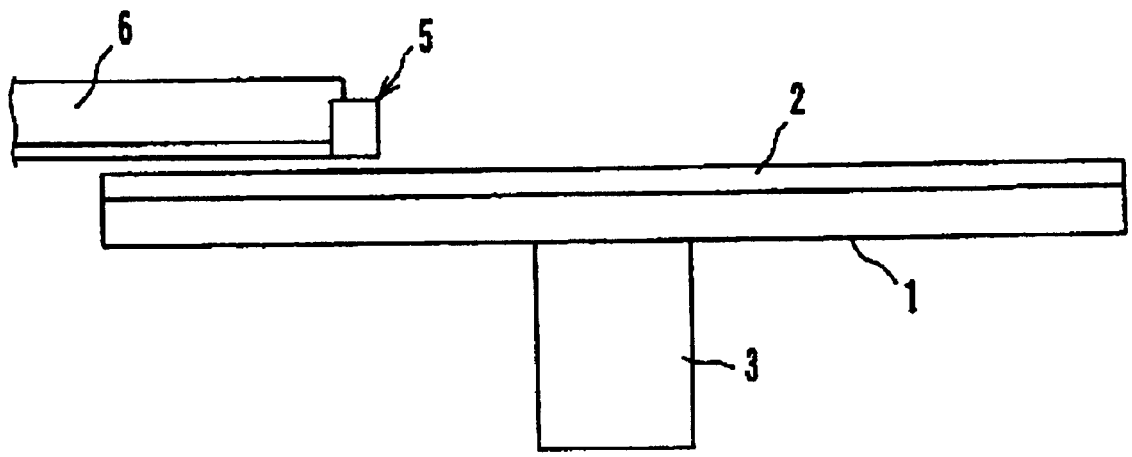
FIG. 1 shows the basic construction of an information recording/reproducing device equipped with the optical head comprising a first embodiment of the present invention.

The near field light generating device comprising a first embodiment of the present invention is indicated as the optical head 5 in FIG. 1, which shows an information recording/reproducing device. In FIG. 1, the recording disk 1 has a recording layer 2 on its surface, and is fixed to a spindle 3 such that it may be driven to rotate at a fixed rate. The optical head 5 is mounted to the end of an actuator 6, and is controlled such that it is kept apart from the surface of the recording disk 1 by a small distance of several tens of nanometers.

Figure 2:
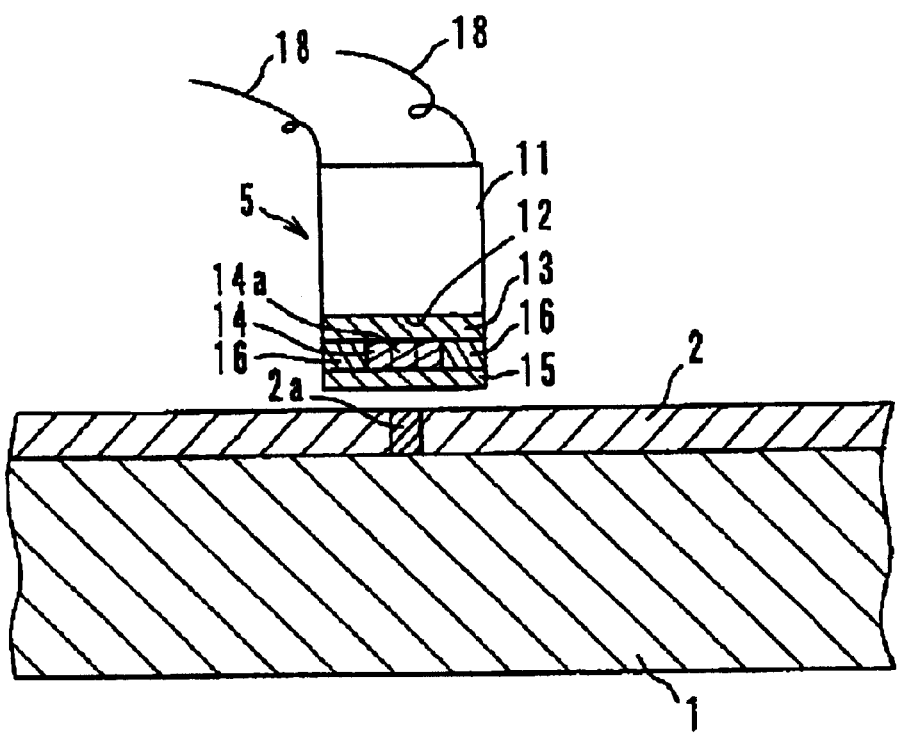
FIG. 2 is a cross-sectional view of the optical head.
Figure 3:
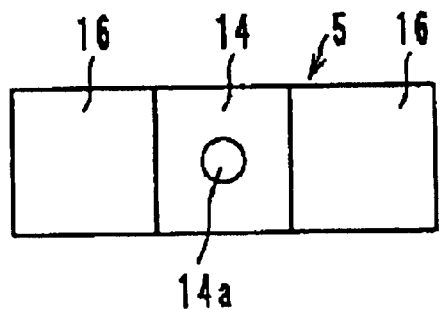
FIG. 3 is a bottom view of the optical head, in which the protective film, which comprises the lowest layer, is omitted.

The optical head 5 comprises a semiconductor laser 11, a heat diffusion preventing film 13 and a low melting point thin film 14 formed in that order on the cleavage plane 12, which is the light exit surface for the semiconductor laser 11, and a protective layer 15 formed on top of the low melting point thin film 14. A pair of light detectors 16 are formed around the low melting point thin film 14, as shown in FIG. 2.

Figure 4:
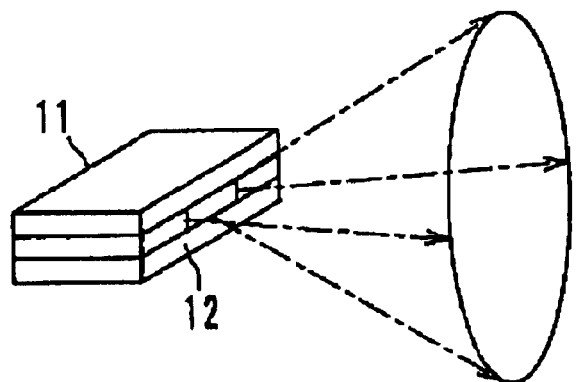
FIG. 4 is a drawing to explain the manner in which the laser light from the semiconductor laser used in the optical head is diffused.
Figure 5:
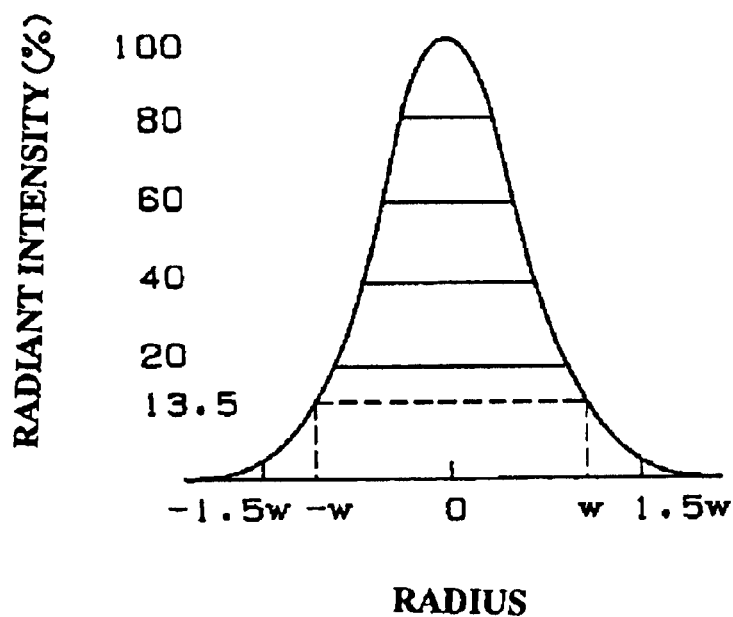
FIG. 5 is a graph showing the distribution of the radiant intensity of the laser light from the semiconductor laser.

Power is supplied to the semiconductor laser 11 from the lines 18 connected to a power supply circuit not shown in the drawing, and the semiconductor laser 11 emits wavelength $\lambda$ laser light from the cleavage plane 12 such that the light is diffused at the angle of expansion shown in FIG. 4. The energy of the laser light has the Gaussian distribution shown in FIG. 5, in which the energy level rises towards the center. FIG. 5 shows the radiant intensity distribution of a $TE_{00}$ mode beam. The radius (w) of the beam is determined by the point at which the intensity is $1/e^2$ of the maximum intensity ($\approx 0.135$).

The heat diffusion preventing film 13 comprises $SiO_2$, for example. The low melting point thin film 14 comprises a material that changes its state from crystalline to amorphous and gains a light transmitting property when heated, such as indium (In) having a melting point of 156.4° C., for example. The protective film 15 comprises diamond-like carbon, for example. The light detector 16 comprises a photo diode. Its material and construction will be explained below together with its manufacturing method.

The recording process using the optical head 5 having the construction described above will now be explained. The laser light emitted from the cleavage plane 12 of the semiconductor laser 11 passes through the heat diffusion preventing film 13, and strikes the low melting point thin film 14, heating the center of the thin film 14 based on the energy distribution shown in FIG. 5. The state of the indium (In), which comprises the thin film 14, begins to change to amorphous when the temperature reaches approximately 130° C. An amorphous light transmitting area 14a is formed, and near field light passes through this light transmitting area 14a.

The size of the light transmitting area 14a formed when light is emitted may be adjusted by controlling the energy supplied to the semiconductor laser 11. It is preferred that the diameter of this opening be adjusted to 100 nanometers. By setting the distance between the optical head 5 and the recording disk 1 to be 20 to 100 nanometers, the near field light passing through the light transmitting area 14a irradiates the recording layer 2, and forms a recording pit 2a. Where the opening diameter of the light transmitting area 14a is 100 nanometers, the diameter of the recording pit 2a also becomes approximately 100 nanometers, and the surface recording density becomes quite high at approximately 50 Gbit per square inch.

When the emission of laser light from the semiconductor laser 11 is stopped, the thin film 14 cools down naturally, and the light transmitting area 14a returns to a crystalline state from an amorphous state.

The reproduction process will now be explained. Similarly to the recording process, near field light passes through the light transmitting area 14a and irradiates the recording layer 2. This near field light is converted into ordinary transmitted light and is reflected. The reflected light is detected by the light detectors 16 and a reproduction signal corresponding to the recording pit 2a is obtained.

During the reproduction, because the light detectors 16 are located very close to the reflection surface (recording layer 2), there is little loss of light, and therefore a good reproduction signal may be obtained. Further, because a pair of light detectors 16 are used, a tracking signal may be detected as well by detecting the difference in detected light amount between the right and left light detectors.

The manufacturing method for the optical head 5 comprising the first embodiment will now be explained with reference to FIG. 6A through FIG. 6E.

Figure 6A:
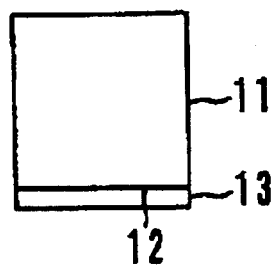
FIG. 6A through FIG. 6E are drawings to explain the manufacturing process for the optical head.
Figure 6B:
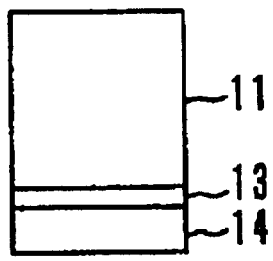
Figure 6C:
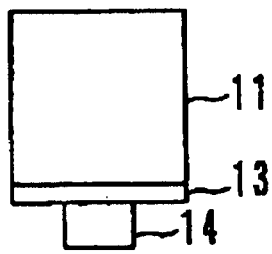

First, $SiO_2$ is formed into a film having a thickness of 10–20 nanometers by means of sputtering as the heat diffusion preventing film 13 on the cleavage plane 12 of the semiconductor laser 11 as shown in FIG. 6A. Indium (In) is then formed into a film having a thickness of 20–50 nanometers by means of sputtering or vacuum deposition as the low melting point thin film 14 as shown in FIG. 6B. The thin film 14 is then processed by means of photo-etching as shown in FIG. 6C. This processing is performed such that the thin film 14 will have a diameter of approximately 300 nanometers with the optical axis at the center.

Figure 6D:
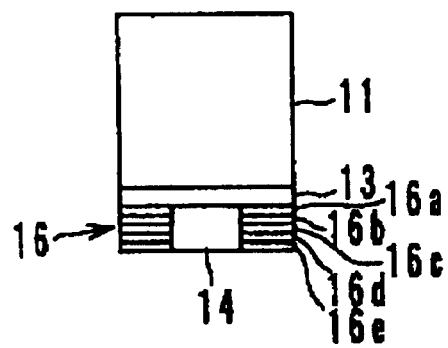

The light detectors (photodiodes) 16 are then formed around the thin film 14. The light detector 16 comprises, as shown in FIG. 6D, an electrode 16a, a P layer 16b, an I layer 16c, an N layer 16d and an electrode 16e. The electrode 16a is formed by patterning aluminum (Al) on the heat diffusion preventing film 13 such that its thickness will be 20 nanometers. The P layer 16b and N layer 16d are made by doping silicon (Si) with phosphate (P) and boric acid (B), respectively, such that a regular pn connection will be formed. The I layer 16c is formed using amorphous silicon (Si). The other electrode 16e is made of aluminum (Al), and is formed using a sputtering method that will give it a thickness of 20 nanometers thickness.

Figure 6E:
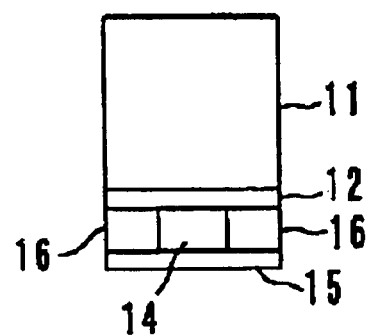

The low melting point thin film 14 and the light detector 16 have the same thickness. Diamond-like carbon is then formed into film having a thickness of 10–20 nanometers by means of ion plating, and becomes the protective film 15 on top of the low melting point thin film 14 and the light detectors 16 as shown in FIG. 6E.

While indium (In), which is a metal material with a low melting point, was used as the material of the thin film 14 in the first embodiment, it is also acceptable to use tin (Sn), which has a melting point of 231.84° C., or lead (Pb), which has a melting point of 327.4° C. Antimony (Sb), which has a melting point of 630.5° C., may be used depending on the film forming parameters.

(Second Embodiment)

The optical head comprising a second embodiment has basically the same construction as the first embodiment shown in FIG. 2, but uses stearic acid, which has a melting point of 70.1° C., for the thin film 14. The manufacturing method for this optical head will be explained with reference to FIGS. 6, 7 and 8.

SiO$_2$ is first formed into film having a thickness of 10–20 nanometers, which is used as the heat diffusion preventing film 13, by means of sputtering on the cleavage plane 12 of the semiconductor laser 11. Stearic acid is then formed into film having a thickness of 50–100 nanometers, which is used as the low melting point thin film 14, by means of vacuum film forming using Knudsen cells, evaporation sources exclusively used for organic materials. The thin film 14 is then processed by means of photo-etching. This processing is performed such that the thin film 14 will have a diameter of approximately 300 nanometers with the optical axis at the center.

Figure 7:
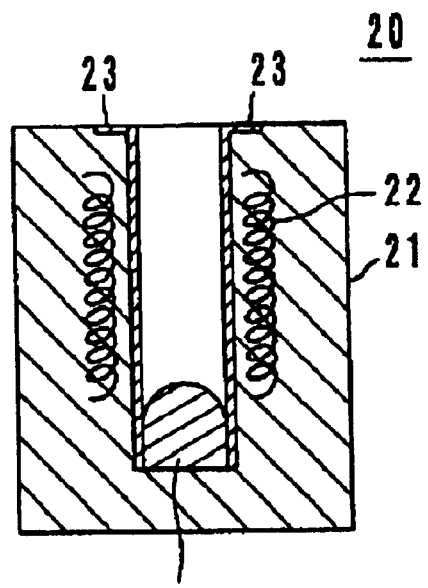
FIG. 7 is a cross-sectional view of the Knudsen cell used in the manufacturing of the optical head comprising a second embodiment of the present invention.
Figure 8:
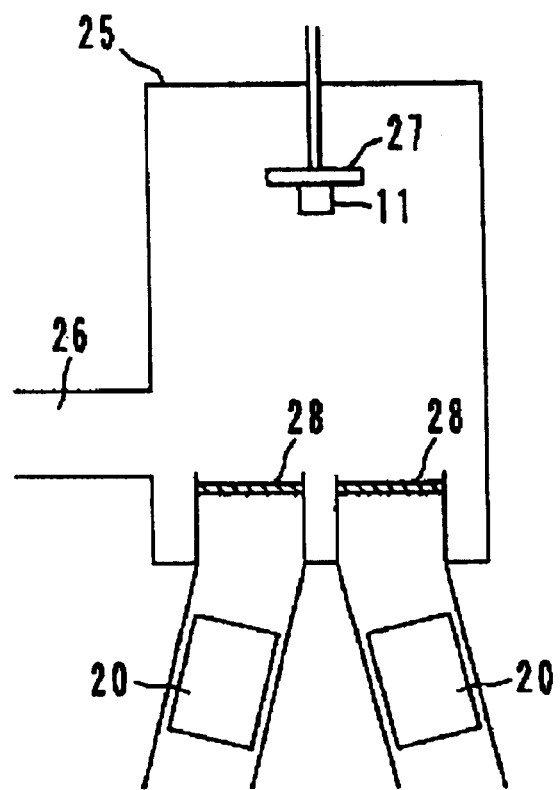
FIG. 8 is a drawing showing the basic construction of the vacuum film forming device used in the manufacturing of the optical head comprising a second embodiment of the present invention.

As shown in FIG. 7, stearic acid is placed in the Knudsen cell 20 comprising a crucible 21 equipped with a heater 22 and a temperature measuring thermocouple 23, and is formed into thin film 14 using a vacuum film forming device. The basic construction of the vacuum film forming device is as shown in FIG. 8. The sample (the semiconductor laser 11) is mounted to the rotary holder 27 inside the vacuum chamber 25 equipped with an evacuation system 26, and the stearic acid is deposited on the sample from a pair of Knudsen cells 20 while the shutters 28 are controlled such that they are opened and closed.

The light detectors (photodiodes) 16 are then formed around the thin film 14. Each light detector 16 comprises, as shown in FIG. 6D, an electrode 16a, a P layer 16b, an I layer 16c, an N layer 16d and an electrode 16e. The electrode 16a is made by patterning aluminum (Al) on the heat diffusion preventing film 13 such that its thickness is 20 nanometers. The P layer 16b and N layer 16d are made by doping silicon (Si) with phosphate (P) and boric acid (B), respectively, such that a normal pn connection will be formed. The I layer 16c is formed using amorphous silicon (Si). The other electrode 16e is made of aluminum (Al), and is formed using a sputtering method that will give it a thickness of 20 nanometers.

The low melting point thin film 14 and the light detector 16 have the same thickness. Diamond-like carbon is then formed into film having a thickness of 10–20 nanometers by means of ion plating, which is used as the protective film 15 and placed on top of the low melting point thin film 14 and the light detectors 16.

While stearic acid was used as the organic material with a low melting point in the second embodiment, it is also acceptable to use lead stearate having a melting point of 125° C.

The recording and reproduction processes in the second embodiment are the same as the first embodiment.

(Third Embodiment)

Figure 9:
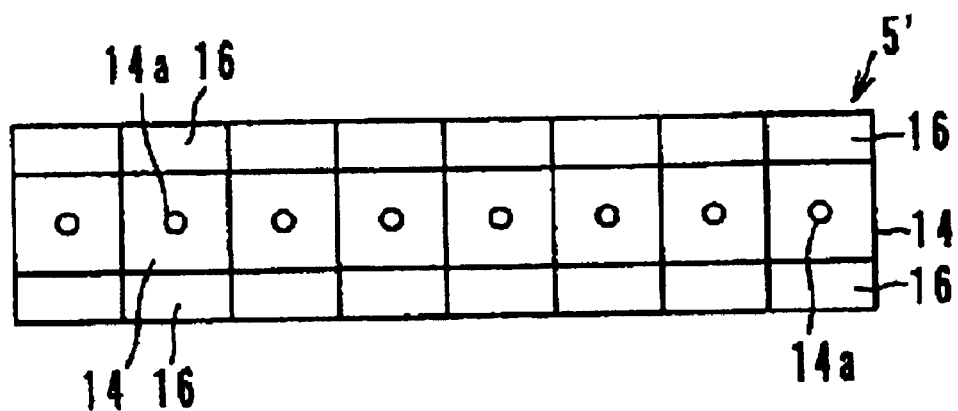
FIG. 9 is a bottom view of the optical head comprising a third embodiment of the present invention, in which the protective film, which comprises the lowest layer, is omitted.

In the third embodiment, as shown in FIG. 9, eight light transmitting areas 14a are formed in a straight line on one optical head 5'. Each near field light emitting element has the same cross-sectional construction as that shown in FIG. 2, and a surface emission semiconductor laser having a quantum well construction is used. The laser light emitted from a surface emission laser of this type also has the characteristics shown in FIGS. 4 and 5. The low melting point thin film 14 is heated using the beam center of the laser light, where the energy intensity is strong, so that the thin film 14 will turn amorphous and a light transmitting area 14a will be formed.

The metal materials or organic materials referred to above in connection with the first and second embodiments may be used for the low melting point thin film 14. For example, as the thin film 14, tin (Sn) having a melting point of 231.84° C. may be formed into film having a thickness of 20–50 nanometers by means of vacuum film forming such as sputtering or vacuum deposition. The remainder of the construction and the manufacturing method is the same as in the first and second embodiments. That near field light passes through each light transmitting area 14a to perform recording and reproduction is identical to that explained with reference to the first embodiment.

Figure 10:
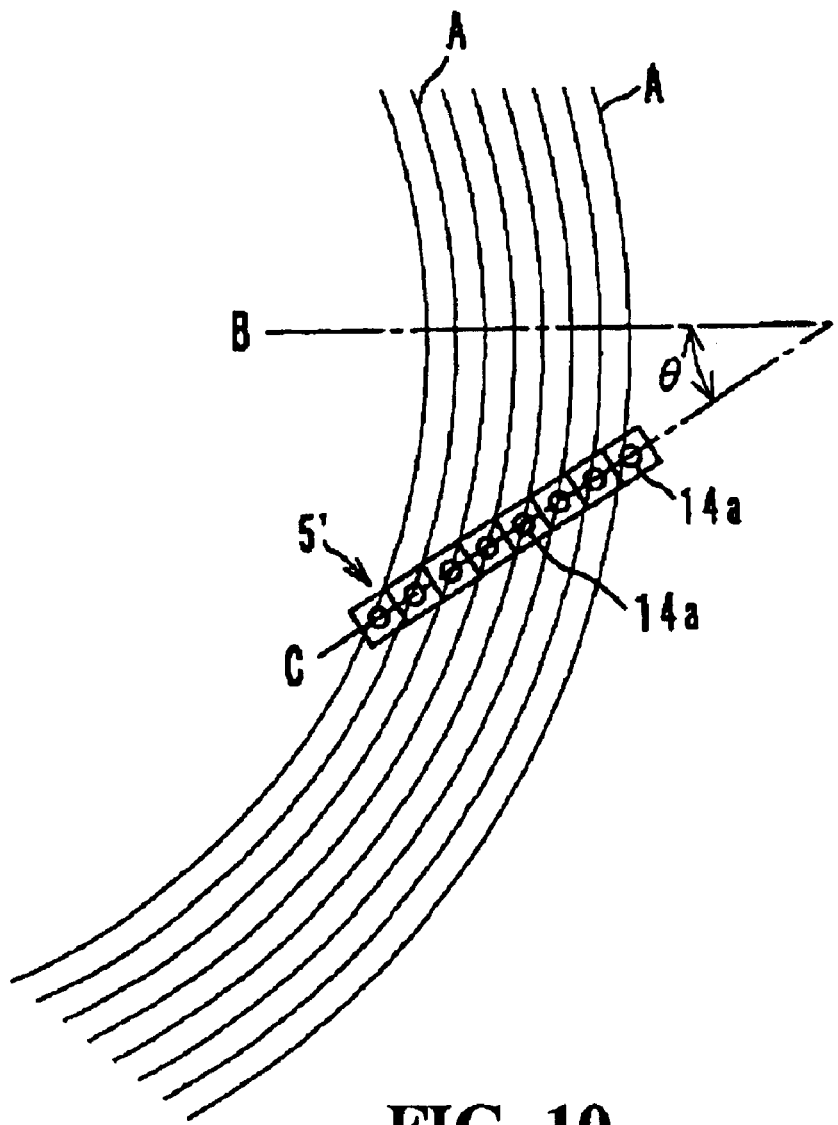
FIG. 10 is a drawing to explain the optical head comprising a third embodiment of the present invention in use.

In the third embodiment, as shown in FIG. 10, the optical head 5' is mounted such that the alignment line C of the light transmitting areas 14a is angled by an angle θ relative to the normal line B of the rotational locuses A of the recording pits, and eight pieces of information are recorded/reproduced at one time. Therefore, the speed of recording/reproduction is eight times as fast as that of the optical head 5 of the first or second embodiment.

(Other Embodiments)

The near field light generating device pertaining to the present invention is not limited to the embodiments explained above, but may be varied within the scope of essence of the invention.

In particular, a laser other than a semiconductor laser or light emitting diodes may be used for the light source. In addition, various materials other than those shown with reference to the embodiments may be used for the low melting point thin film or other components.

Although the present invention has been fully described by way of examples with reference to the accompanying drawings, it is to be noted that various changes and modifications will be apparent to those skilled in the art. Therefore, unless such changes and modification depart from the scope of the present invention, they should be construed as being included therein.

What is claimed is:

1. A near field light generating device, comprising:
   a light emitting element that emits light from its exit surface; and
   a thin film disposed on the exit surface,
   wherein the thin film is configured to release emitted light as near field light from an area of the thin film when the thin film is irradiated with light from said light emitting element and to block light from the area of the thin film when the thin film is not irradiated with light from said light emitting element.

2. A near field light generating device according to claim 1, wherein said thin film changes its state from a crystalline state to an amorphous state when irradiated with light from said light emitting element.

3. A near field light generating device according to claim 1, wherein said thin film returns to a crystalline state from an amorphous state when the light emission is stopped.

4. A near field light generating device according to claim 1, wherein said thin film consists essentially of an inorganic material having a melting point of 350° C. or lower.

5. A near field light generating device according to claim 1, wherein said thin film consists essentially of an inorganic material having a melting point of 150° C. or lower.

6. A near field light generating device according to claim 1, wherein said thin film consists essentially of an organic material having a low melting point.

7. A near field light generating device according to claim 1, further comprising a heat diffusion preventing film between the light exit surface and the thin film.

8. A near field light generating device according to claim 1, wherein said light emitting element includes a semiconductor laser device.

9. A near field light generating device, comprising:
   a light emitting element that emits light from its exit surface; and
   a thin film disposed on the exit surface,
   wherein the thin film is configured to release emitted light as near field light from an area of the thin film when the thin film is heated and to block light from the area of the thin film when the thin film is not heated.

10. A near field light generating device according to claim 9, wherein said thin film changes its state from a crystalline state to an amorphous state when heated.

11. A near field light generating device according to claim 9, wherein said thin film returns to a crystalline state from an amorphous state when the light emission is stopped.

12. A near field light generating device according to claim 9, wherein said thin film consists essentially of an inorganic material having a melting point of 350° C. or lower.

13. A near field light generating device according to claim 9, wherein said thin film consists essentially of an inorganic material having a melting point of 150° C. or lower.

14. A near field light generating device according to claim 9, wherein said thin film consists essentially of an organic material having a low melting point.

15. A near field light generating device according to claim 9, further comprising a heat diffusion preventing film between the light exit surface and the thin film.

16. A near field light generating device according to claim 9, wherein said light emitting element includes a semiconductor laser device.

17. A near field light generating device according to claim 9, wherein said thin film is heated by the light emitted from said light emitting element.

* * * * *